United States Patent
Bosiers et al.

(10) Patent No.: US 6,747,701 B2
(45) Date of Patent: Jun. 8, 2004

(54) IMAGE RECORDING DEVICE WITH IMPROVED IMAGE STORAGE TRANSITION

(75) Inventors: Jan Theodoor Jozef Bosiers, Eindhoven (NL); Agnes Catharina Maria Kleimann, Eindhoven (NL)

(73) Assignee: Dalsa Corporation, Waterloo (CA)

( * ) Notice: Subject to any disclaimer, the term of this patent is extended or adjusted under 35 U.S.C. 154(b) by 0 days.

(21) Appl. No.: 10/208,672

(22) Filed: Jul. 30, 2002

(65) Prior Publication Data

US 2003/0025819 A1 Feb. 6, 2003

(30) Foreign Application Priority Data

Aug. 2, 2001 (EP) .............................. 01202927

(51) Int. Cl.$^7$ ................................. H04N 3/14
(52) U.S. Cl. .................. 348/317; 348/315; 348/320; 257/231
(58) Field of Search ................... 348/317, 311, 348/314, 315, 319, 320; 257/231, 291

(56) References Cited

U.S. PATENT DOCUMENTS

| | | | | |
|---|---|---|---|---|
| 4,924,316 A | * | 5/1990 | Kobayashi et al. | 348/222.1 |
| 5,315,137 A | * | 5/1994 | Asaumi et al. | 257/221 |
| 5,548,142 A | * | 8/1996 | Arakawa | 257/234 |
| 2002/0048837 A1 | * | 4/2002 | Burke et al. | 438/48 |

FOREIGN PATENT DOCUMENTS

WO    WO9817051    4/1998    ............. B60R/7/06

OTHER PUBLICATIONS

H. Peek et al. 'An FT–CCD image with true 2.4 x 2.4 $\mu m^2$ pixels in double membrane poly–Si technology' (IEDM 1996 pp. 35.3.1–4).

* cited by examiner

*Primary Examiner*—Ngoc-Yen Vu
*Assistant Examiner*—Heather R. Long
(74) *Attorney, Agent, or Firm*—Dorsey & Whitney LLP

(57) ABSTRACT

The present invention relates to an image recording device (10), comprising:

an image section (11) with a number of picture elements (pixels) arranged in rows and columns;

a storage section (12) with image storage elements arranged in rows and columns for (temporarily) at least partially storing charge absorbed by the pixels, wherein the charge is transferred to the storage elements;

wherein one or more gates close to the transition (13) between the image section and the storage section are lengthened.

18 Claims, 4 Drawing Sheets

| | 1 | 2 | 3 | 4 | 5 | 6 |
|---|---|---|---|---|---|---|
| A2 | − | − | − | + | + | + |
| A3 | + | + | − | − | − | + |
| A4 | + | + | + | + | − | − |
| A1 | − | + | + | + | + | + |
| A2 | − | − | − | + | + | + |
| A3 | + | + | − | − | − | + |
| A4 | + | + | + | + | − | − |
| B1 | − | + | + | + | + | + |
| B2 | − | − | − | + | + | + |
| B3 | + | + | − | − | − | + |
| B4 | + | + | + | + | − | − |
| B1 | − | + | + | + | + | + | t →

FIG. 4A

| | 1 | 2 | 3 | 4 | 5 | 6 |
|---|---|---|---|---|---|---|
| A2 | − | − | − | + | + | + |
| A3 | + | + | − | − | − | + |
| A4 | + | + | + | + | − | − |
| A1 | − | + | + | + | + | + |
| A2 | − | − | − | + | + | + |
| A3 | + | + | − | − | − | + |
| A4 | + | + | + | + | − | − |
| B1 | − | − | − | − | − | − |
| B2 | − | − | − | − | − | − |
| B3 | + | + | + | + | + | + |
| B4 | + | + | + | + | + | + |
| B1 | − | − | − | − | − | − | t →

FIG. 4B

IMAGE RECORDING DEVICE WITH IMPROVED IMAGE STORAGE TRANSITION

BACKGROUND

1. Field of the Invention

The invention relates to a device such as an image recording device for application as a so-called 'Digital Still Camera' that is often provided with an FT-CCD (Frame Transfer-Charge Coupled Device) and usually requires a real-time preview mode, for example for an electronic viewfinder such as an LCD screen, a display on a television in accordance with the NTSC or PAL standard, or for camera functions such as horizontal and vertical automatic focusing.

2. Description of Related Art

Such an FT-CCD with a storage section of limited size is known, for example, from the international patent application PCT/IB97/01201 (WO 9817051). Although a charge dump is performed with a vertical overflow drain in this known image recording device, and a sampled image is thus transported to the storage section, the speed hereof is in need of improvement, while the further performance of the sensor such as a high maximum charge value Qmax and a high frame shift frequency, must be retained and charge overflow must be avoided.

SUMMARY OF THE INVENTION

According to a first aspect of the present invention, which has for its object to obviate the above problems, an image recording device is provided comprising:

an image section with a number of picture elements (pixels) arranged in rows and columns;

a storage section with image storage elements arranged in rows and columns for (temporarily) at least partially storing charge absorbed by the pixels, wherein the charge is transferred to the storage elements, wherein the number of rows in the storage section is fewer than the number of rows in the image section;

characterized in that one or more gates close to the transition between the image section and the storage section are longer than gates more remote from the transition.

According to a further aspect of the present invention, wherein substantially the same problems are obviated, an image recording device is provided comprising:

an image section with a number of picture elements (pixels) arranged in rows and columns;

a storage section with image storage elements arranged in rows and columns for temporarily at least partially storing the charge absorbed by the pixels, characterized in that the charge is transferred to the storage elements;

wherein the doping profile below one or more gates which are close to the transition between the image recording section and the storage section is modified with respect to that below the gates located further away.

As a result of the present invention, the dumping of charge during subsampling is facilitated, i.e. fewer problems occur at high speeds, while a charge overflow between charge packages is also avoided as much as possible at high speeds.

BRIEF DESCRIPTION OF THE DRAWINGS

Further advantages, features and details of the present invention will be elucidated on the basis of the following description of a preferred embodiment thereof with reference to the annexed drawings, in which:

FIGS. 4A and 4B are diagrammatic views serving to explain the operation of the device shown in FIGS. 1–3.

DETAILED DESCRIPTION OF EMBODIMENTS

Figure 1:
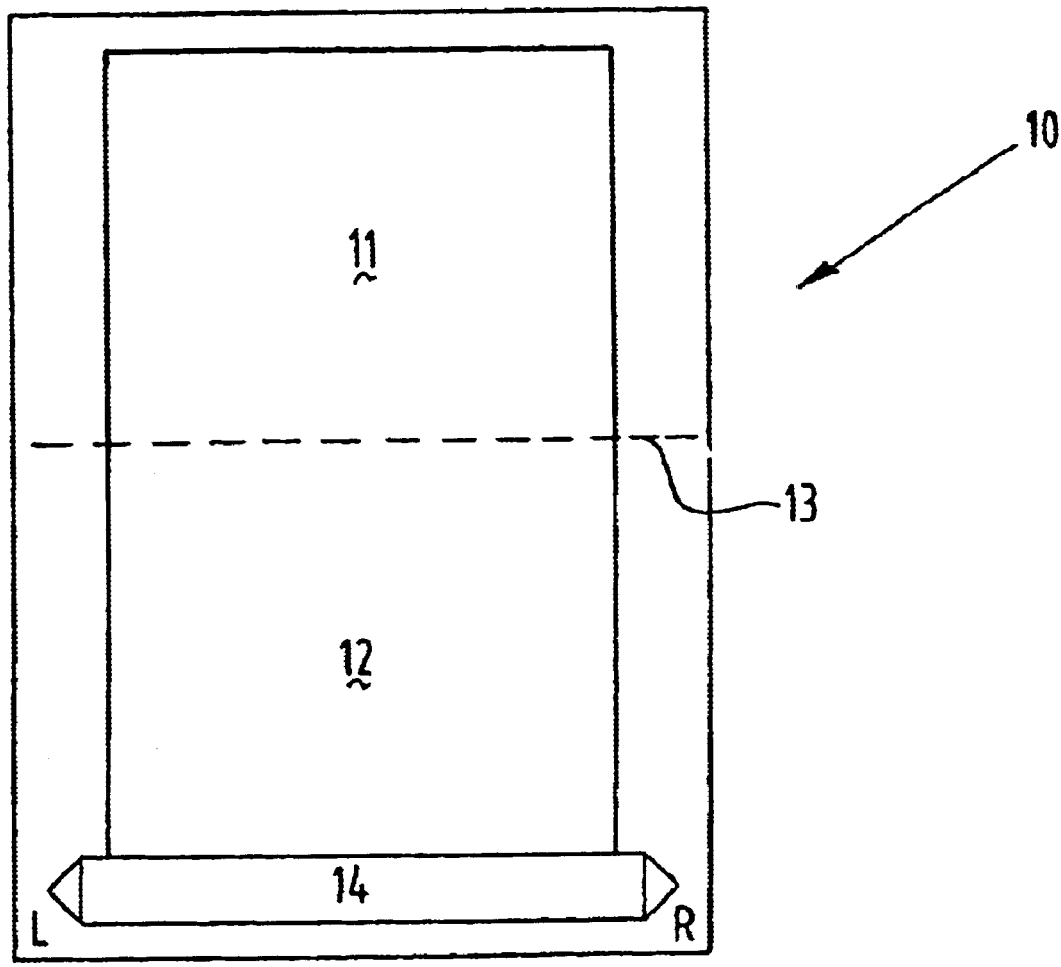
FIG. 1 is a diagrammatic view of a preferred embodiment of an image recording device according to the present invention.

An image recording device 10 (FIG. 1) comprises a recording part 11 and a storage part 12, with a transition 13, diagrammatically indicated with a broken line, between the parts 11 and 12. Furthermore, a so-called horizontal read-out register 14 is connected to the storage part.

Figure 2:
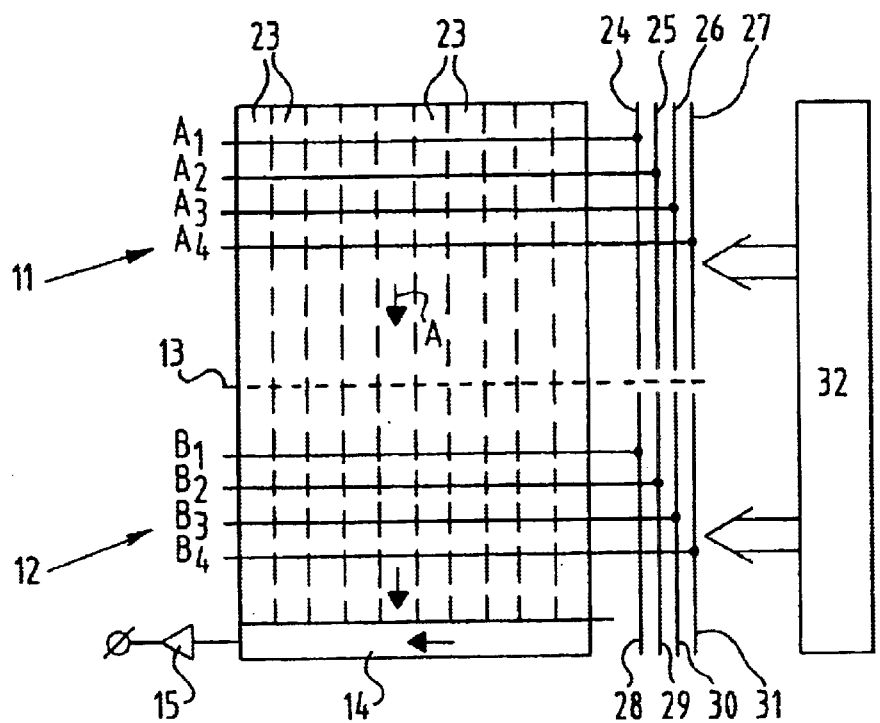
FIG. 2 is a diagrammatic view of a device as shown in FIG. 1 for the purpose of elucidating the operation thereof.

The diagrammatic view of FIG. 2 further shows vertical channels 23 along which the charge can be transported from the recording part 11 to the storage part 12 in the direction of an arrow A. Four-phase driven electrodes A1 to A4 for gates arranged above channels 23 in the image recording area are connected to clock lines 24, 25, 26, and 27, respectively, while electrodes B1 to B4 in the storage area are connected to clock lines 28, 29, 30, 31, respectively. Clock lines 24 to 31 are driven from a diagrammatically indicated clock driving circuit 32.

The present embodiment relates to a four-phase image recording device. In a practical embodiment, the recording part 11 comprises 1280 horizontal lines and 960 vertical channels, wherein the electrodes A1 to A4 are repeated in each case. The storage part 12 then has a smaller capacity of for instance 240 lines by 960 vertical channels, i.e. a notably smaller number of lines than the image recording part.

Figure 3:
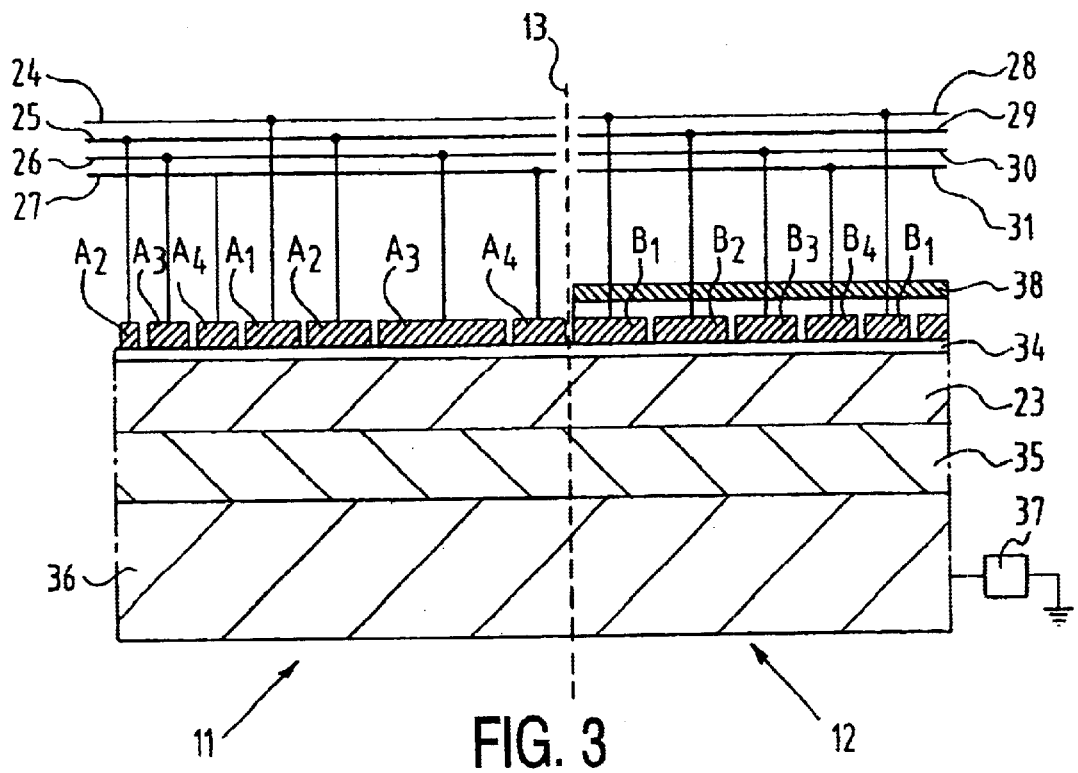
FIG. 3 is a diagrammatic view of a possible preferred embodiment of the device shown in FIGS. 1 and 2.

As can be seen in FIG. 3, electrodes A1, A2, A3, A4, B1, B2, B3, B4, B1 forming the gates are arranged close to the transition 13 on an insulating layer 34 on the channels 23, under which a p-type layer 35 is provided on a substrate 36 which is brought to the desired voltage by a voltage source 37. Also shown in FIG. 3 is a diagrammatically indicated light-screening layer 38 which prevents light from penetrating into the storage part 12 and which is preferably integrated into the circuit in a manner not shown.

In the embodiment shown in FIG. 3, the gates A2, A3, A4, A1, A2, A3, A4, B1, B2, B3, B4, B1 close to the transition 13 have the following lengths:

A2=0.8 $\mu$m

A3=0.8 $\mu$m

A4=0.8 $\mu$m

A1=1.0 $\mu$m

A2=1.2 $\mu$m

A3=2.4 $\mu$m

A4=1.0 $\mu$m

B1=1.4 $\mu$m

B2=1.4 $\mu$m

B3=1.2 $\mu$m

B4=1.0 $\mu$m

B1=0.8 $\mu$m whereas the other gates (not shown) further removed from the transition all have a length of about 0.8 $\mu$m.

The p-well at the transition was lower-doped, in the present embodiment by narrowing the implementation width under the last two image electrodes to 1.6 μm, as opposed to 2.4 μm at the other gates.

In contrast to the diagram of FIG. 4A, in which six clock cycles are shown in a four-phase CCD at normal charge transport, the diagram of FIG. 4B shows the drive diagram in subsampling, wherein the surplus charge must be drained to the substrate at the third clock cycle and lateral leakage thereof must be avoided. At clock cycle t4 there remains only one blocking gate (A3) between the charge package that needs to be drained below A4 and the charge package of the pixel lying thereabove. At clock cycle t3 the maximum charge capacity amounts to, for example, only 30,000 electrons, whereas that at step t4 it is no more than 25,000 electrons. The surplus must also be drained rapidly to the substrate at clock cycle t4.

Owing to the design of the lengths of the gates as described above, a practically symmetrical separation is sufficiently realized from both the previous charge package below A1 and A2 and the subsequent one below B3 and B4.

As a result of the lower p-well doping and/or higher n-channel doping under the gate A4, and partially under the gates A3, B1 and B2, close to the transition, a lower barrier to the substrate and a higher channel potential are locally obtained. Dumping of charge is accelerated owing to the lower barrier. The higher channel potential avoids flowing away of any residual charge still present below A4 at the moment this just (dis)connects to a previous or subsequent charge package situated, for example, below gate A3 or B1 or B2.

Simulations have shown that the above changes in p-well or n-channel doping and gate lengths avoid charge flowing away to the substrate in an undesired manner during normal transport or remaining behind owing to poor transport.

Two-dimensional and three-dimensional effects also lead to better charge reset conditions below the relatively long "disconnected" gates close to the transition (A3+A4+B1+B2=6.2 μm). The charge package therebelow is enclosed by longer switched-on gates than below a package of gates of constant length wherein A3+A4+B1+B2 would amount to about 3.7 μm.

Figure 5A:
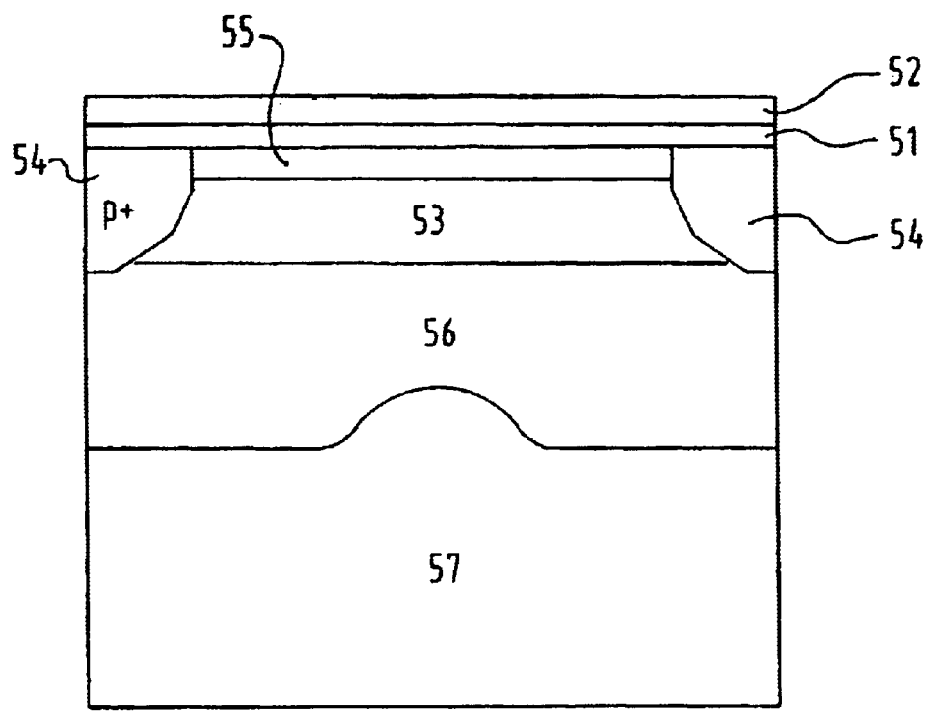
FIGS. 5A and 5B are a view in cross-section and a plan view, respectively, of part of an image recording device according to the present invention in which the device according to the present invention can be applied.
Figure 5B:
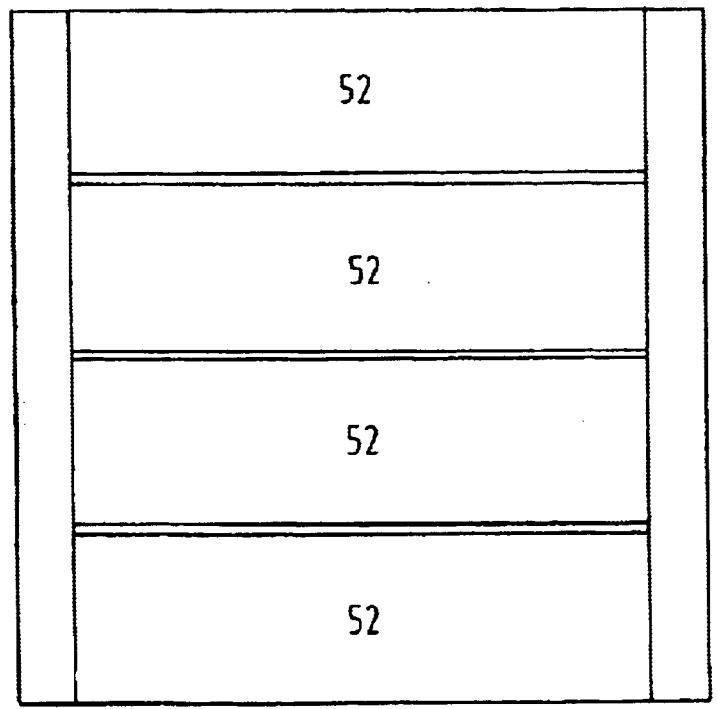

In the example of a four-phase pixel of FIG. 5A (shown in cross-section) and 5B (shown in plan view), in which the longer gates close to the transition in accordance with the above description are preferably used, further details of which are described in the article by H. Peek et al. 'An FT-CCD image with true 2.4×2.4 μm² pixels in double membrane poly-Si technology' (IEDM 1996 pp. 35.3.1–4), four gates with a length of 0.9 μm of polysilicon 52 are each situated on an insulating layer 51, while an n-channel 53 extends between two stop areas 54. A so-called profiled peristaltic implant 55 for enlarging the well, i.e. the charge capacity, is situated between the oxide layer and the n-channel, while a p-well 56 is situated on the n-substrate 57 under the n-channel 53.

The present invention is not limited to the above preferred embodiments thereof; the rights sought are defined by the following claims, within the scope of which many modifications can be envisaged.

What is claimed is:

1. An image recording device, comprising:
   an image section with a number of picture elements arranged in rows and columns;
   a storage section with image storage elements arranged in rows and columns for at least partially storing charge absorbed by the pixels, wherein the charge is transferred to the storage elements, wherein the number of rows in the storage section is fewer than the number of rows in the image section;
   characterized in that one or more gates close to the transition between the image section and the storage section are longer than gates more remote from the transition.

2. An image recording device as claimed in claim 1, characterized in that the second gate of the image section, as seen from the transition, has a length of approximately 2.5 to 3 times the length of a gate further away from the transition.

3. An image recording device as claimed in claim 1, characterized in that the doping below one or more gates close to the transition between the image recording section and the storage section is modified with respect to the doping between the gates located further away.

4. An image recording device as claimed in claim 1, characterized in that the channel potential obtained under the gates close to the transition is higher than that obtained at a distance therefrom.

5. An image recording device as claimed in claim 1, characterized in that:
   the doping below one or more gates close to the transition between the image recording section and the storage section is modified with respect to the doping between the gates located further away: and
   the modified doping is characterized by a lower doping concentration constituted by a lowered doping.

6. An image recording device as claimed in claim 1, characterized in that the first two gates of the storage section, have a dimension which is approximately 50% longer is than that of the gates at a greater distance from the transition.

7. An image recording device as claimed in claim 6, characterized in that:
   the doping below one or more gates close to the transition between the image recording section and the storage section is modified with respect to the doping between the gates located further away; and
   the modified doping is characterized by a lower doping concentration constituted by a lowered doping.

8. An image recording device as claimed in claim 6, characterized in that the channel potential obtained under the gates close to the transition is higher than that obtained at a distance therefrom.

9. An image recording device as claimed in claim 6, characterized in that the doping below one or more gates close to the transition between the image recording section and the storage section is modified with respect to the doping between the gates located further away.

10. An image recording device as claimed in claim 6, characterized in that the second gate of the image section, as seen from the transition, has a length of approximately 2.5 to 3 times the length of a gate further away from the transition.

11. An image recording device as claimed in claim 10, characterized in that the channel potential obtained under the gates close to the transition is higher than that obtained at a distance therefrom.

12. An image recording device as claimed in claim 10, characterized in that the doping below one or more gates close to the transition between the image recording section and the storage section is modified with respect to the doping between the gates located further away.

13. An image recording device as claimed in claim 12, characterized in that the channel potential obtained under the gates close to the transition is higher than that obtained at a distance therefrom.

14. An image recording device as claimed in claim 12, characterized in that the modified doping is characterized by a lower doping concentration constituted by a lowered doping.

15. An image recording device comprising: an image section with a number of picture elements arranged in rows and columns; a storage section with charge storage elements arranged in rows and columns for temporarily at least partially storing the charge of absorbed by the pixels, wherein the charge is transferred to the storage elements, wherein the number of rows in the storage section is fewer than the number of rows in the image section; characterized in that the doping below one or more gates close to the transition between the image recording section and the storage section is modified with respect to that below the gates located further away and one or more gates closer to the transition are longer than the gates more remote from the transition.

16. An image recording device as claimed in claim 15, characterized in that the width of the n-well or the peristaltic implant or the p-well of the pixels at the transition is modified with respect to that of the pixels located further away.

17. An image recording device as claimed in claim 16, characterized in that the modified doping is characterized by a lower doping concentration constituted by a lowered doping.

18. An image recording device as claimed in claim 15, characterized in that the modified doping is characterized by a lower doping concentration constituted by a lowered doping.

* * * * *